(12) United States Patent
Ditlow et al.

(10) Patent No.: US 6,383,847 B1
(45) Date of Patent: May 7, 2002

(54) PARTITIONED MASK LAYOUT

(75) Inventors: Gary S. Ditlow, Garrison; Fook-Luen Heng, Yorktown Heights; Mark A. Lavin, Katonah; Daniel L. Ostapko, Mahopac; Jung H. Yoon, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/699,895

(22) Filed: Oct. 30, 2000

(51) Int. Cl.7 .............................................. H01L 21/82
(52) U.S. Cl. ...................................... 438/128; 438/361
(58) Field of Search ................................ 438/114, 128, 438/213, 238, 276, 280, 361, 618, 666

(56) References Cited

U.S. PATENT DOCUMENTS

| | | | | |
|---|---|---|---|---|
| 4,817,093 A | * | 3/1989 | Jacobs et al. | 371/25 |
| 4,835,704 A | * | 5/1989 | Eichelberger et al. | 364/490 |
| 5,166,888 A | * | 11/1992 | Engelke | 364/491 |
| 6,204,567 B1 | * | 3/2001 | Imamura | 257/797 |

\* cited by examiner

Primary Examiner—David Nelms
Assistant Examiner—Phuc T. Dang
(74) Attorney, Agent, or Firm—Ference & Associates

(57) ABSTRACT

In connection with the manufacture of chips having partitioned logic, a partitioned mask layout approach. This approach provides the chip exposure pattern as a set of partitions corresponding to macros or core functions and also handles glue logic and interconnect. A result of this approach is a simplified, cost-effective process that does not defer customization to other, potentially more time-consuming and inefficient tasks.

17 Claims, 5 Drawing Sheets

IDEAL ABUTMENT

MISALIGNMENT CAN CAUSE WIRES TO DISCONNECT ON WAFER.

MISALIGNMENT CAN ALSO CAUSE SHORTING OF WIRES BETWEEN PARTITIONS.

PARTITIONED MASK LAYOUT

FIELD OF THE INVENTION

The present invention relates generally to chips having partitioned logic and, more particularly, to masking, such as lithographic masking, in connection therewith.

BACKGROUND OF THE INVENTION

As silicon capability continues to double every 18 months, the ability to design and manufacture chips increasingly becomes key to their deployment. The times required to synthesize chips have begun to exceed the required time to market. The increasingly complex efforts relating to physical design of the chips have accorded a great sense of urgency on handling "second order" effects to meet time-related goals. For instance, the resolution of minimum device features comparable to (or smaller than) the wavelength of the exposing light has made the lithography for mask making increasingly complex and expensive. All of these second order effects are conspiring to increase the cost of designing a chip to the point where only high volume chips are economically viable.

The industry has responded to this situation by initiating the development of System-On-a-Chip (SOC) methodologies. This approach is successful in partitioning the logic on a chip into quasi-independent regions. However, the difficulty in practicing SOC has led to the introduction of a "platform" approach, wherein variants within the class of designs are implemented on identical or nearly identical hardware.

This platform approach leaves some of the customization of the SOC to software, which, from the point of view of productivity, appears to present even greater problems than hardware. The SOC approach fails to address the dramatically increasing costs related to mask data preparation and mask building. Though methods involving partitioning and hierarchy have been helpful in the synthesis and design of both chips and systems, the SOC approach does not use such methods for the mask generation process.

In view of the foregoing, a need has been recognized in connection with decreasing the time-to-market associated with chip manufacture, addressing the problem of dramatically increasing data generation and mask build costs, and providing an expanded model for sharing the masks of significant portions of a chip.

SUMMARY OF THE INVENTION

In accordance with at least one presently preferred embodiment of the present invention, a partitioned mask layout approach is broadly contemplated. As will be appreciated from the detailed discussion herebelow, this approach provides the chip exposure pattern as a set of partitions corresponding to macros or core functions and also handles glue logic and interconnect. A result of this approach is a simplified, cost-effective process that does not defer customization to other, potentially more time-consuming and inefficient tasks. It will be appreciated that the sharing of masks or mask data to dramatically decreases both time to market and the non-recurring-engineering (NRE) cost of chip design.

In one aspect, the present invention provides a method of providing masking for a chip having partitioned logic, the method comprising the steps of: providing a chip having partitioned logic; providing masking; the step of providing masking comprising providing a chip exposure pattern, the chip exposure pattern comprising at least one partition corresponding to at least one of: at least one macro of the chip and at least one core function of the chip.

In an additional aspect, the present invention provides masking for a chip having partitioned logic, the masking comprising a chip exposure pattern, the chip exposure pattern comprising at least one partition corresponding to at least one of at least one macro of the chip and at least one core function of the chip.

For a better understanding of the present invention, together with other and further features and advantages thereof, reference is made to the following description, taken in conjunction with the accompanying drawings, and the scope of the invention will be pointed out in the appended claims.

BRIEF DESCRIPTION OF THE DRAWINGS

FIGS. 1a–1c schematically illustrate the implementation of abutment rules in a partitioned mask layout approach, wherein FIG. 1a shows ideal abutment, FIG 1b shows misaligned abutment and FIG. 1c shows the impact of the "blurring" of shapes.

FIGS. 2a and 2b schematically illustrate the implementation of extension rules in a partitioned mask layout approach, wherein FIG. 2a shows the initial extension of shape beyond the partition boundary and FIG. 2b shows actual abutment beyond the extension boundary.

DESCRIPTION OF THE PREFERRED EMBODIMENTS

Figure 1A:
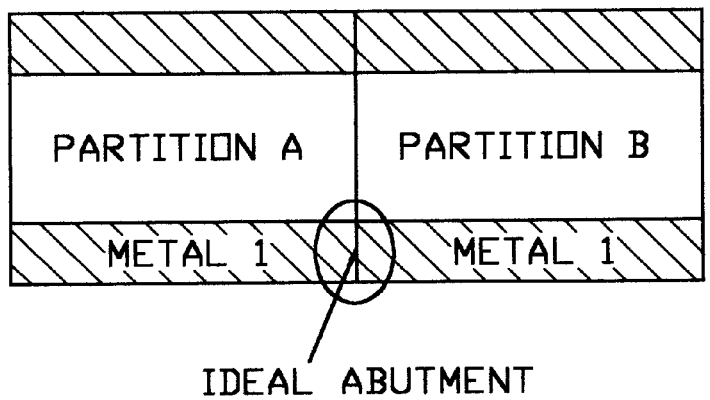

This section of the disclosure first addresses the sharing of reusable intellectual property (IP).

Generally, the design and manufacture of systems on a chip requires hierarchical or partitioned approaches to provide reuse. This reuse is often described as intellectual property (IP) that can be shared and reused. IP currently constitutes about 50% of a typical SOC. This percentage is expected to continue to increase. Several forms of IP are available today, such as soft (e.g. hardware description language), firm (e.g. hardware description language with placement information), and hard (e.g. mask layout data).

Generally, the reuse of any of these forms presents problems relating to the allocation of responsibility for performance. More particularly, since the IP, typically described as logic (e.g. a netlist of interconnected primitive elements), logic with placement (netlist plus relative location of the primitive elements), or layout (mask data for each layer) must either be converted to layout or combined with other layout, the responsibility for performance failure is not clear. Accordingly, in accordance with at least one presently preferred embodiment of the present invention, a partitioned mask description of IP, together with any required constraints on physical or electrical interaction, should make the performance a clear responsibility of the IP owner. The owner could verify the function and performance on a test chip and be confident of its operation if indeed it was manufactured within tolerances. The presently contemplated partitioned mask approach greatly reduces physical design costs and time by reusing physical layout masks.

Generally, the partitioned mask approach provides the chip exposure pattern as a set of partitions corresponding to macros or core functions, plus glue logic and interconnect (both of which are defined further below). Each partition will preferably be generated from a complete set of layer masks that can be projected onto any location on the chip. The chip is thus composed from a set of macros, much as the printed circuit board was used to construct a circuit from individual chips. If the description of each partition is given as electronic mask data in addition to a physical mask, a further optimization is possible. In this further optimization, early hardware can be generated using the separate physical masks and, after testing or qualifying the design, a smaller set of masks or a single mask can be generated from the electronic data. This mask or masks should preferably produce the same or nearly identical hardware and, as such, should be easy to qualify. Thus, the presently contemplated partitioned mask approach allows early hardware to be generated without extensive physical design and mask build, followed by an easily qualified manufacturing optimization if volume warrants it. This approach, with slight modifications, can also be used to speed up the process of implementing a change to one of the macros on a chip. The new mask for that portion can be combined with the mask or masks for the remainder of the chip in the manner described above.

The disclosure now turns to a discussion of considerations relating to reusable IP design.

It may be assumed that, in the presently contemplated partitioned mask layout approach, a chip is composed of a set of partitions (e.g., macros, cores, glue logic, etc.). Each partition is a complete set of masks to be printed onto the wafer layer by layer independently. For example, if a chip is composed of macro A and macro B, mask layer 1 of macro A is printed onto the wafer then mask layer 1 of macro B is printed onto the wafer and the processing associated with that layer is performed, then mask layer 2 of macro A and mask layer 2 of macro B is printed and the layer processed and so on.

Figure 1B:
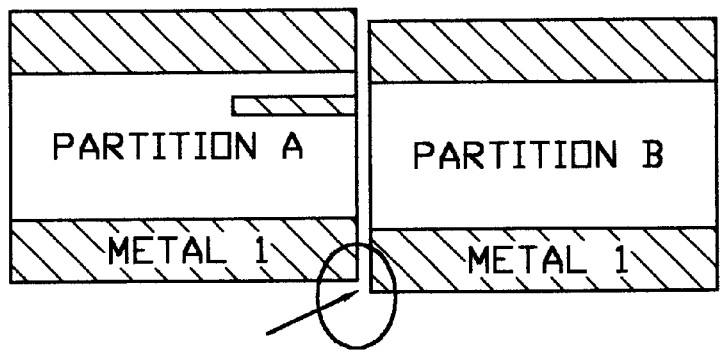
Figure 1B:
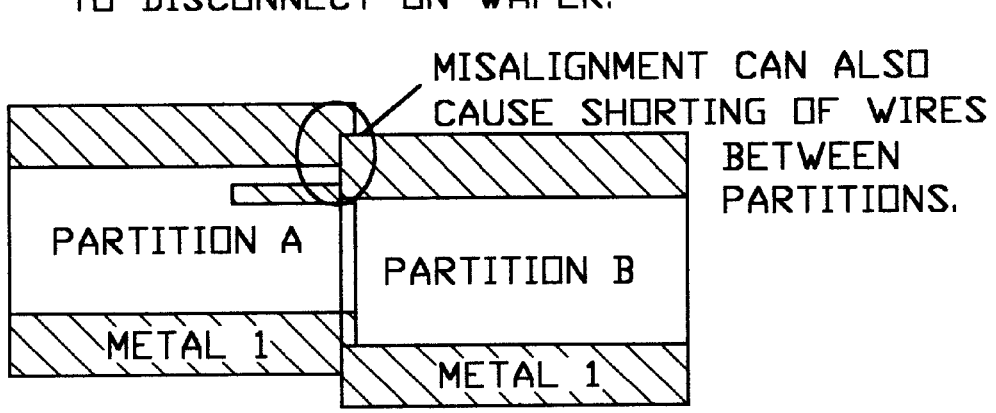
Figure 1C:
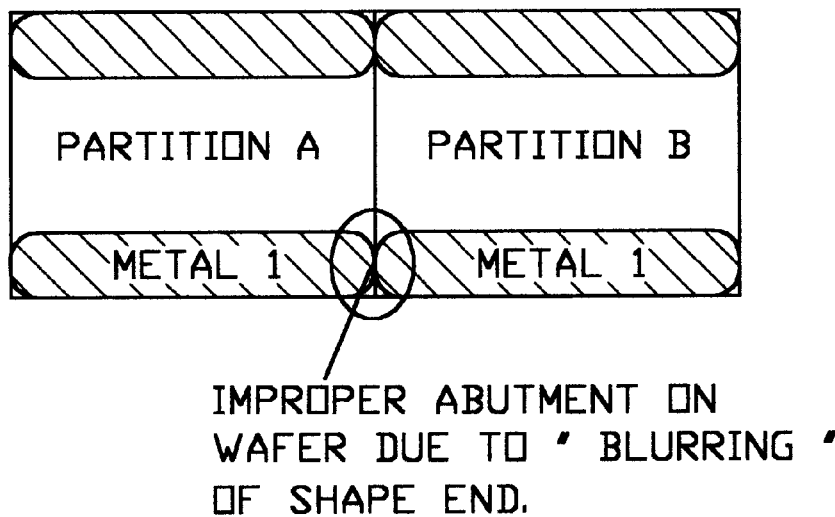
Figure 2A:
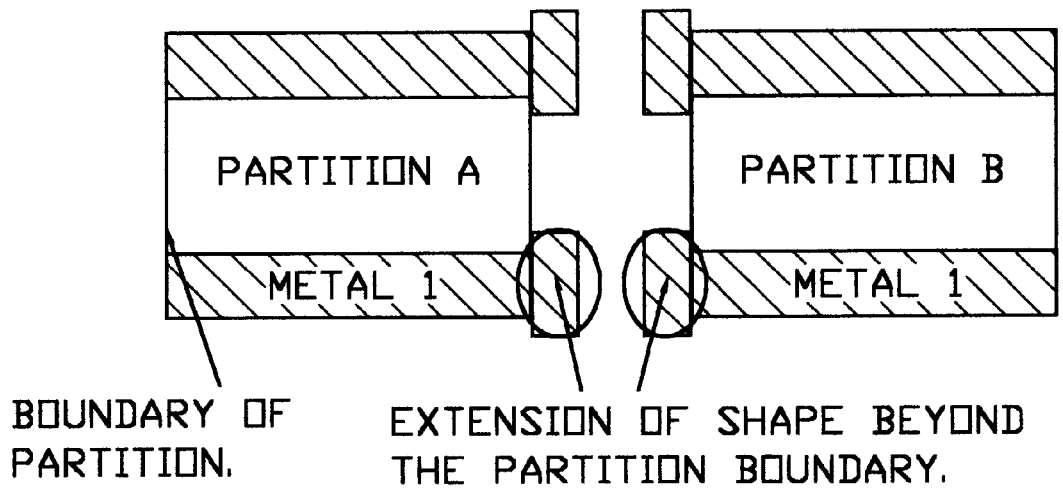
Figure 2B:
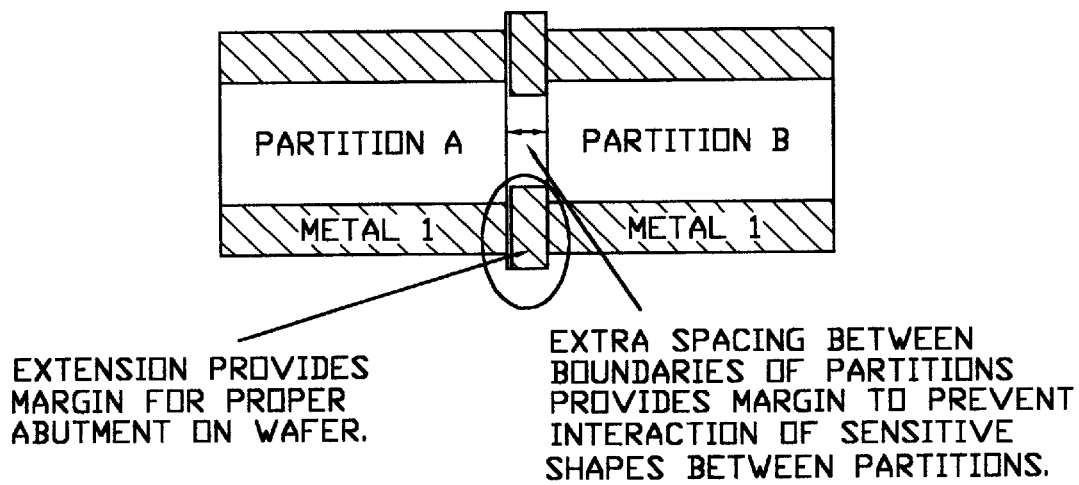

Preferably, there will be two types of electrical connections that provide the interconnection between partitions. The first type is connection by abutment, as illustrated by FIGS. 1a–c. For example, a power bus on the metal 1 layer of partition A may be abutted with the power bus on the metal layer 1 of partition B. Since the metal 1 of partition A is printed onto the wafer at a different time than the metal 1 of partition B, the abutment may not be exact due to alignment errors and due to "blurring" of the metal 1 shape end. Thus, special abutment rules will preferably be considered when using the positioned mask layout approach as shown in FIGS.1a–c. These rules will provide a margin so that connection by abutment will actually be accomplished when layers are printed onto the wafer. The rules will also preferably prevent the shorting of adjacent wires, as shown in FIG. 2a–b. These abutment rules will preferably consolidate the process tolerance rules, the partition misalignment rules, and the abutment constraints. The final mask data will incorporate these shapes as well as any modifications made to accommodate context dependent lithographic processing.

Figure 3:
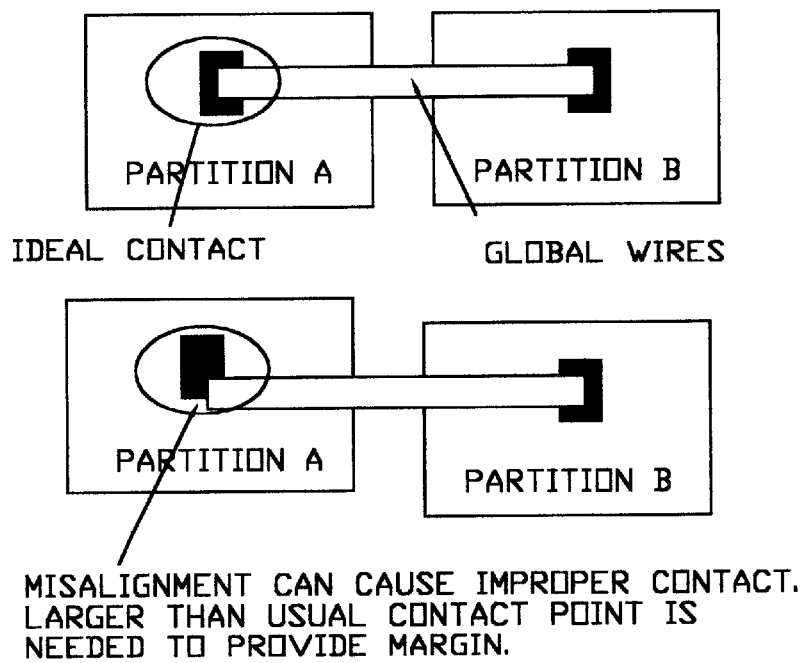
FIG. 3 schematically illustrates contact modification for global routing.

The second type of electrical connection is similar to global wires between ordinary macros. This amounts to reserving certain interconnection layers for interconnecting partitions. The interconnection is not part of the partition mask set. Again, due to the independence of mask layers between partitions, special rules will preferably be built into the contacts between the partitions and the global wires as shown in FIG. 3. These interconnection patterns will preferably be subject to the same position and size requirements as described for connection by abutment.

Figure 4:
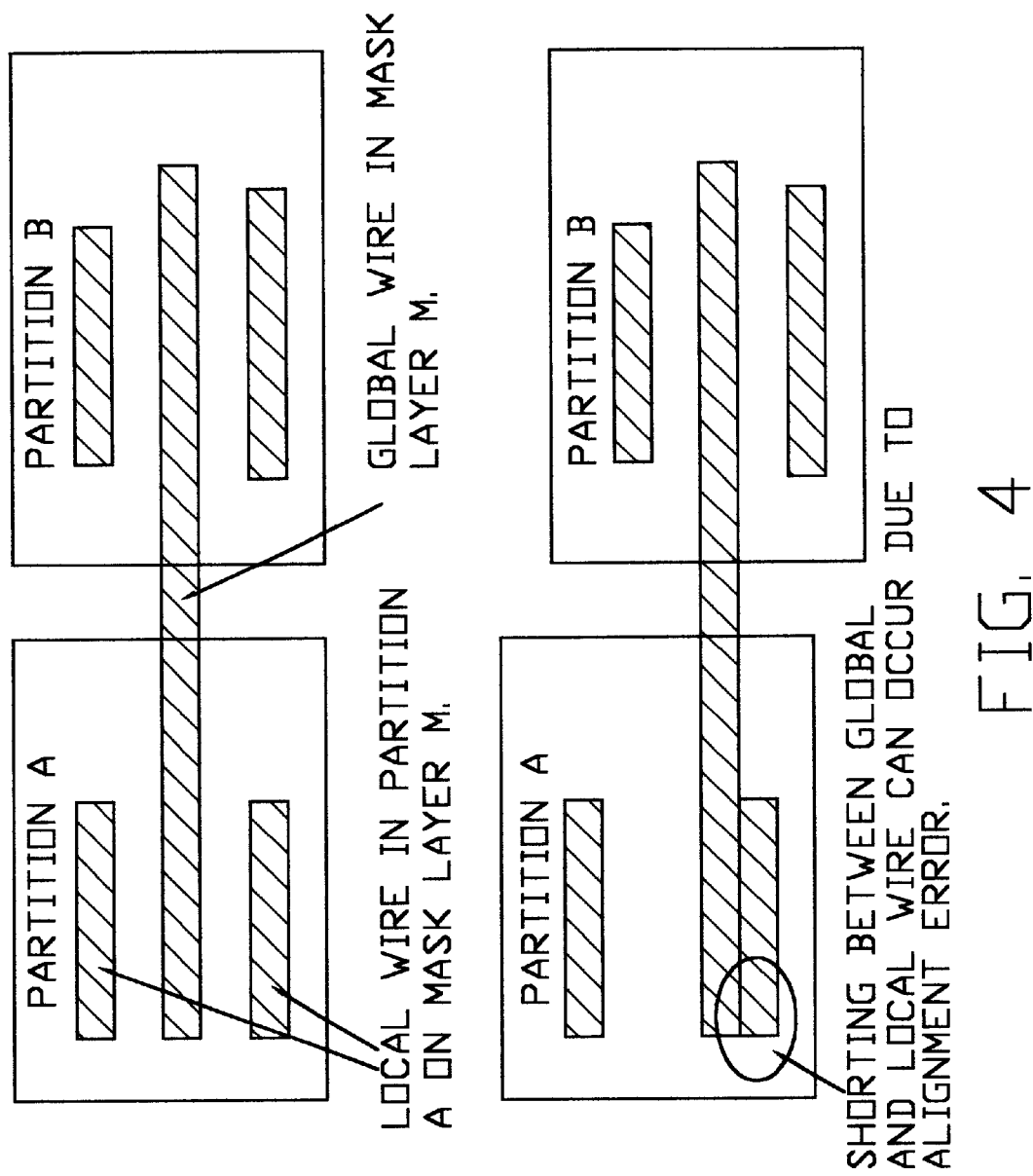
FIG. 4 schematically illustrates space modification for global routing.

Since each partition is designed independently, extra care needs to be taken to guarantee noise immunity or electrical isolation. This can be accomplished by providing a guard band around the partition or by moving sensitive circuitry toward the interior where the surroundings are known and can be analyzed. With sufficient care, it is possible to allow global wires on the layer that is already present on the mask set of a partition to pass through or connect to the partition. When enough space is left between wires and/or shapes of a mask layer in a partition, shapes of the same mask layer can be superimposed on the partition after the mask layer of the partition has been printed onto the wafer, as shown in FIG. 4.

Preferably, the system integrity of a chip using the presently contemplated partitioned mask layout approach will be verified before fabrication. New simulation and modeling techniques which take into consideration the possible misalignment of the partitions of a mask layer which are printed onto the wafer at different times are desirable to more accurately verify the system integrity of the chip. Other tools that check the correctness of the electrical properties of the in situ partitions also should preferably be developed. The development of tools to automatically perform these system checks will require an extension of existing design tools.

It will be appreciated that the partitioned mask approach provides many advantages. Synthesis can be applied to any portion of the logic for which this makes economic sense from both a design point of view and a reuse point of view. Accordingly, physical design can focus on a function that will be reused and thus optimize the layout mask beyond what is economically expedient merely for a single use.

A model for IP design becomes much clearer. The IP provider can work with the silicon foundry to build and test a macro that can be placed on an OEM chip with the IP provider's masks. Thus, the question of responsibility becomes much clearer. Finally, the mask costs will likely be decreased considerably in view of the reuse that is possible, in addition to the inherently lower cost for building and checking the collection of smaller masks rather than the single large one.

The disclosure now turns to a discussion of a preferred implementation of a partitioned mask method.

It may be assumed that designs to be built using the presently contemplated partitioned mask method include three types of layout elements:

reusable elements—large macros such as microprocessor cores, static or dynamic memory arrays, etc.;

glue logic—relatively simple combinational and storage elements, used to communicate data and control among the reusable elements; and interconnect—passive wires distributing power, clocks and data among reusable elements and glue logic.

It may further be assumed that these elements can be composed subject to the following constraints:

Reusable elements are placed with sufficient spacing to other reusable elements and glue logic so that there are no significant proximity effects.

Interconnects have sufficient feature size and spacing that they are not significantly affected by proximity effects.

Given these assumptions, there are several ways to build a design including the above-described elements, as discussed below.

In one embodiment of the present invention, there may be one mask set per reusable element. In this case, each reusable element is implemented with a dedicated mask set. The masks may hold a single placement of the reusable element or multiple placements, to increase the likelihood that a given mask has at least one "in spec."placement (i e., defect-free and within critical dimen the dedicated mask is stepped across the wafer.

This process is then preferably repeated for the each of the other reusable elements, each of which occupies its own dedicated mask set.

Glue logic is preferably implemented here using a technique similar to traditional gate-arrays. Particularly, an additional mask set that includes an array of unconnected, small logic components (e.g., gates and registers) is stepped across the wafer in a manner similar to that which was done for one of the reusable elements. Alternatively, glue logic may be implemented by surrounding each reusable element on its respective mask with a "halo" or band of glue logic components. Then, a sufficient amount of this halo needed to implement the required glue logic can be selected by suitable "shuttering" or masking of the reticle to form an enlarged version of the reusable element.

Interconnects (which also provide the wiring among the array of logic components to implement the glue logic) may be implemented either by building a small number of simple masks and stepping those across the wafer, or by using means such as direct-write electron beam to expose the interconnect patterns without the need for building any masks.

Among the advantages of this "one mask set per reusable element" implementation are the following:

1. The mask set for the reusable elements may simply be the mask set (suitably "shuttered") for a prototype or stand-alone version of the reusable element.
2. By exposing a single reusable element at a time, the exposure field can be kept relatively small and close to the center of the exposure tool's optical field, possibly minimizing distortions.
3. As noted previously, the mask set for a given reusable element can include multiple placements of that element, from which the best placement (defect free, closest to intended critical dimensions) can be chosen.

Another presently contemplated implementation involves the use of multiple reusable elements on a single mask set.

This is similar to the "one mask set per reusable element" case above, except that more than one kind of reusable element is placed on each reusable mask set. A primary implication of this is that when a level for a design including several reusable elements is to be exposed, it is not necessary to remove one mask (e.g., for reusable element "A") from the stepper tool and replace it with a second mask (e.g., for reusable element "B").

Glue logic and interconnects are preferably implemented similarly to the "one mask per reusable element" case above.

Figure 5:
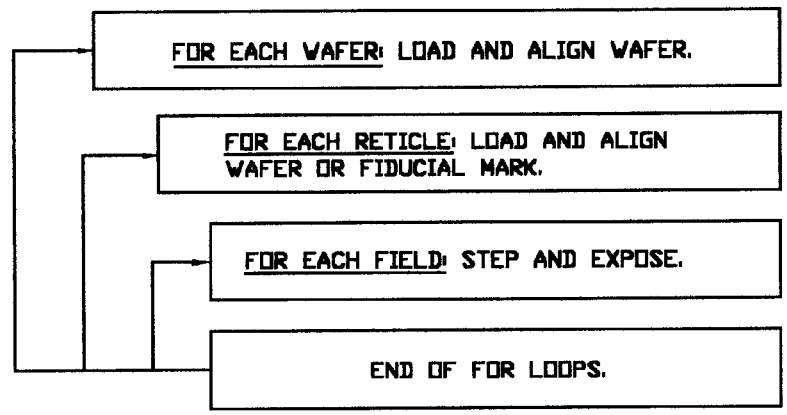
FIG. 5 provides a flowchart schematically illustrating a standard method of chip exposure.
Figure 6:
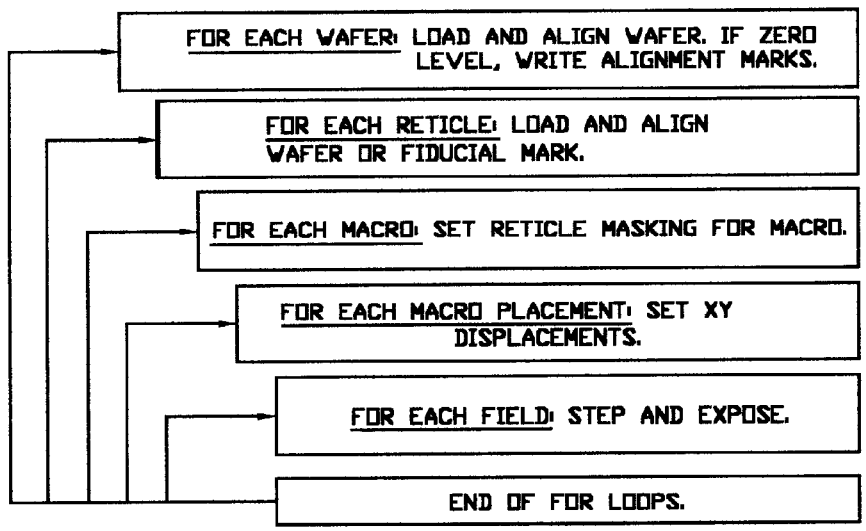
FIG. 6 provides a flowchart schematically illustrating a method for handling reusable mask elements.

The "Mask Exposure Flowchart" in FIG. 5 shows a standard method of chip exposure, while the "Modified Mask Exposure Flowchart" in FIG. 6 shows the method for handling reusable mask elements. With relation to FIG. 6, if glue logic and interconnect masks or generation is considered as a reusable element or macro, the flowchart can be taken to describe the exposure process for a SOC.

In another presently contemplated embodiment of the present invention, a single mask set may be implemented with "job decking".

Here, it is not preexisting masks that are reused, but rather preexisting mask data; the advantage is predicated on the assumption (increasingly true) that a significant part of mask-making cost and time goes into the preparation of data that are used to build the mask, e.g., the data that drive the mask-making tool (e-beam or optical).

Whereas it is common practice today to combine mask-making data, e.g., data that have varying spatial precision, by "job-decking", in which these data are used to expose the mask blank in several passes, one per data set, the present invention broadly contemplates, in accordance with at least one presently preferred embodiment, using essentially the same technique to compose the pre-generated mask-making data for the various reusable elements, along with data for the glue logic and interconnect that are generated once per new part (rather than preexisting). Assuming that these are a relatively small fraction of the entire design data, the cost and complexity to generate these data "on the fly" would be acceptable. A primary advantage of this approach is the simplification of the wafer exposure process. Also, though a new mask set must be produced for each new design, the amount of data processing is significantly reduced when compared with current practice.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method of providing masking for a chip having partitioned logic, said method comprising the steps of:

providing a chip having partitioned logic;

providing masking, said step of providing masking comprising providing a chip exposure pattern, said chip exposure pattern comprising at least one partition corresponding to at least one macro of said chip or at least one core function of said chip;

wherein said step of providing a chip exposure pattern further comprises providing at least one partition that comprises a set of at least two masks.

2. The method according to claim 1, wherein said step of providing a chip exposure pattern comprises providing at least one partition that further comprises at least one of: glue logic and interconnect.

3. The method according to claim 1, wherein said step of providing a chip exposure pattern further comprises providing at least one partition that further comprises a description in the form of electronic mask data.

4. The method according to claim 1, wherein said step of providing a chip exposure pattern further comprises providing at least two partitions and at least one interconnection between said partitions, said at least one interconnection comprising at least one of: an abutment interconnection and at least one global wire.

5. The method according to claim 1, wherein:

said step of providing a chip comprises providing a wafer layer; and said at least two masks are printed onto said wafer layer independently and layer by layer.

6. The method according to claim 1, wherein:

said step of providing a chip comprises providing at least one reusable element; and one set of at least two masks corresponds to each reusable element.

7. The method according to claim 6, wherein:

said step of providing a chip comprises providing at least two reusable elements; and one set of at least two masks corresponds to at least two reusable elements.

8. The method according to claim 1, wherein said step of providing masking comprises providing masking that was used previously.

9. The method according to claim 1, wherein said step of providing masking comprises providing preexisting mask data.

10. Masking for a chip having partitioned logic, said masking comprising a chip exposure pattern, said chip exposure pattern comprising at least one partition corresponding to at least one macro of said chip or at least one core function of said chip.

11. The masking according to claim 10, wherein said at least one partition further comprises at least one of glue logic and interconnect.

12. The masking according to claim 10, wherein said at least one partition further comprises a description in the form of electronic mask data.

13. The masking according to claim 10, wherein said chip exposure pattern comprises at least two partitions and at least one interconnection between said partitions, said at least one interconnection comprising at least one of: an abutment interconnection and at least one global wire.

14. The masking according to claim 10, wherein said chip exposure pattern comprises at least one partition that comprises a set of at least two masks.

15. The masking according to claim 10, wherein one set of at least two masks corresponds to a single reusable element of a chip.

16. The masking according to claim 10, wherein said masking is previously used.

17. The masking according to claim 10, wherein said masking comprises preexisting mask data.

* * * * *

UNITED STATES PATENT AND TRADEMARK OFFICE
CERTIFICATE OF CORRECTION

PATENT NO. : 6,383,847 B1
DATED : May 7, 2002
INVENTOR(S) : Ditlow et al.

It is certified that error appears in the above-identified patent and that said Letters Patent is hereby corrected as shown below:

Column 7,
Line 6, "claim 6" should read -- claim 1 --;

Column 8,
Line 2, "at least one of" should read -- at least one of: --.

Signed and Sealed this

Twenty-fourth Day of September, 2002

Attest:

Attesting Officer

JAMES E. ROGAN
Director of the United States Patent and Trademark Office